(12) United States Patent
Teo

(10) Patent No.: US 7,190,232 B1
(45) Date of Patent: Mar. 13, 2007

(54) SELF-BIASED ACTIVE VCO LEVEL SHIFTER

(75) Inventor: Swee-Ann Teo, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 161 days.

(21) Appl. No.: 10/747,521

(22) Filed: Dec. 29, 2003

Related U.S. Application Data

(60) Provisional application No. 60/470,689, filed on May 14, 2003.

(51) Int. Cl.
*H03B 5/12* (2006.01)

(52) U.S. Cl. .................. 331/36 C; 331/177 V; 331/117 FE; 327/566; 257/312; 257/595; 257/600

(58) Field of Classification Search ........ 331/36 C, 331/177 V, 117 FE; 327/581, 566; 361/277, 361/278, 280, 281; 257/312, 595, 598, 600, 257/601
See application file for complete search history.

(56) References Cited

U.S. PATENT DOCUMENTS

| | | | |
|---|---|---|---|
| 6,246,864 B1 * | 6/2001 | Koike | ............ 455/110 |
| 6,292,065 B1 | 9/2001 | Friedman et al. | |
| 6,362,698 B1 | 3/2002 | Gupta | |
| 6,469,587 B2 | 10/2002 | Scroggins | |
| 6,545,555 B1 * | 4/2003 | Justice et al. | ........... 331/117 R |

FOREIGN PATENT DOCUMENTS

EP 0942531 A2 9/1999

OTHER PUBLICATIONS

HongMo Wang A 9.8 GHz back-gate tuned VCO in 0.35 CMOS, IEEE interaction Solid-State Circuits Conference Feb. 15-17, 1999 pp. 406-407.*

"802.16 IEEE Standard for Local and Metropolitan Area Networks; Part 16: Air Interface for Fixed Broadband Wireless Access Systems," 802.16 IEEE Standard for Local and Metropolitan Area Networks, Oct. 1, 2004, pp. i-xxxiv and pp. 1-857, IEEE Std 802.16-2004, IEEE, United States.

IEEE Std. 802.16; IEEE Standard for Local and metropolitan area networks; Part 16: Air Interface for Fixed Broadband Wireless Access Systems; Apr. 8, 2002; pp. 1-322.

ANSI/IEEE Std. 802.11, 1999 Edition; Part 11: Wireless LAN Medium Access Cntrol (MAC) and Physical Layer (PHY) Specifications; Information technology—Telecommunications and information exchange between systems—Local and metropolitan area networks—Specific requirements; pp. 1-512.

(Continued)

*Primary Examiner*—Michael B Shingleton

(57) ABSTRACT

A voltage-controlled oscillator (VCO) circuit includes first, second, third, and fourth transistors, each with a first terminal, a second terminal, and a control terminal. The first terminal of the first transistor communicates with the first terminal of the second transistor. The control terminals of the third and fourth transistors communicate with the second terminals of the first and second transistors, respectively. The first terminals of the third and fourth transistors communicate with the control terminals of the first and second transistors, respectively. First ends of first and second capacitances communicate with the second terminals of the first and second transistors, respectively. Second ends of the first and second capacitances communicate with the control terminals of the first and second transistors, respectively.

28 Claims, 5 Drawing Sheets

OTHER PUBLICATIONS

IEEE P802.11g/D8.2 Apr. 2003 (Supplement to ANSI/IEEE std. 802.11 1999(Reaff 2003)) Draft Supplement Standard for Part 11: Wireless LAN Medium Access Cntrol (MAC) and Physical Layer (PHY) Specifications; Information technology—Telecommunications and information exchange between systems—Local and metropolitan area networks—Specific requirements; Further Higher Data Rate Extension in the 2.4 GHz Band; pp. 1-69.

IEEE Std. 802.11a-1999; Supplement to IEEE Standard for Information Technology—Telecommunications and information exchange between systems—Local and metropolitan area networks—Specific requirements; Part: 11 Wireless LAN Medium Access Control (MAC) and Physical Layer (PHY) specifications; High-speed Physical Layer in the 5 GHz Band; pp. 1-83.

IEEE Std. 802.11b; Supplement to IEEE Standard for Information technology—Telecommunications and information exchange between systems—Local and metropolitan area networks—Specific requirements; Part 11: Wireless LAN Medium Access Control (MAC) and Physical Layer (PHY) specifications: Higher-Speed Physical Layer Extension in the 2.4 GHz Band; Approved Sep. 16, 1999; pp. 1-89.

IEEE Std. 802.11b-1999/Cor 1-2001;IEEE Standard for Information technology—Telecommunications and information exchange between systems—Local and metropolitan area networks—Specific requirements; Part 11: Wireless LAN Medium Access Cntrol (MAC) and Physical Layer (PHY) Specifications; Amendment 2: Higher-speed Physical Layer (PHY) extension in the 2.4 GHz band—Corrigendum 1; pp. 1-15.

IEEE Std. 802.16; IEEE Standard for Local and metropolitan area networks; Part 16: Air Interface for Fixed Broadband Wireless Access Systems; Apr. 8, 2002; pp. 1-322.

IEEE Std. 802.16a; IEEE Standard for Local and metropolitan area networks; Part 16: Air Interface for Fixed Broadband Wireless Access Systems—Amendment 2: Medium Access Control Modifications and Additional Physical Layer Specifications for 2-11 GHz; Apr. 1, 2003; pp. 1-292.

* cited by examiner

SELF-BIASED ACTIVE VCO LEVEL SHIFTER

CROSS-REFERENCE TO RELATED APPLICATIONS

This application claims the benefit of U.S. Provisional Application No. 60/470,689, filed on May 14, 2003, which is hereby incorporated by reference in its entirety.

FIELD OF THE INVENTION

The present invention relates to oscillator circuits, and more particularly to voltage-controlled oscillator circuits.

BACKGROUND OF THE INVENTION

Oscillator circuits produce an output that varies periodically at a predetermined frequency. Oscillator circuits typically operate based on positive feedback. In a voltage-controlled oscillator (VCO), the principle tuning element is a varactor diode. The VCO is tuned across a frequency band by applying a DC voltage to the varactor diode, which varies the net capacitance of a tuned circuit.

VCOs may be implemented in frequency synthesizers such as phase-locked loops (PLLs). The PLLs, in turn, may be implemented in a device such as a wireless communications device. In wireless communications devices, the VCO provides a clock signal that is used by a transceiver during a frequency up-conversion and a down-conversion process. The clock signal ideally has no phase noise, which creates frequency fluctuations in the output signal. When the PLL is locked, the VCO may contribute noise at higher frequencies.

Referring to FIG. 1, an exemplary PLL 10 includes a phase detector 12, a charge pump 14, a filter 16, a VCO 18, and a divider 20. The phase detector 12 receives a reference frequency signal 22. For example, a crystal oscillator may be used to provide the reference frequency signal 22. The phase detector 12 also receives an output signal 24 from the divider 20. The phase detector 12 compares the reference frequency signal 22 and the divider output signal 24 and generates a phase error signal 26. The phase error signal 26 is a measure of the phase difference between the reference frequency signal 22 and the divider output signal 24. Typically, the phase error signal 26 is a DC voltage that is output to the charge pump 14, which converts the value of the phase error signal 26 into an absolute DC voltage or a VCO voltage signal 28.

Because the VCO 18 is sensitive to fluctuations in the VCO voltage signal 28, the filter 16 filters the VCO voltage signal 28 from the charge pump 14. The VCO 18 generates an output signal 32 at a desired frequency based on the value of the filtered VCO voltage signal 30.

The divider 20 receives the output of the VCO 32. Since the desired value for the output frequency of the VCO 18 is generally different than the reference frequency, the divider 20 is used to adjust the value of the output signal 32 based on the ratio of the desired output frequency to the reference frequency. Based on the feedback from the VCO 18, the PLL 10 locks the output signal 32 onto the reference frequency signal 22 and maintains a fixed relationship.

Referring now to FIG. 2, a first VCO circuit 40 includes first and second transistors 42 and 44, respectively. For example, the first and second transistors 42 and 44, respectively, may be bi-polar junction transistors (BJTs) that have bases, collectors, and emitters. However, other types of transistors may be used. An emitter (or terminal) of the first transistor 42 communicates with an emitter of the second transistor 44. The first VCO circuit 40 also includes first and second capacitors 46 and 48, respectively, that AC couple positive feedback of the first and second transistors 42 and 44, respectively. A first end of the first capacitor 46 communicates with a collector (or terminal) of the first transistor 42 and a second end of the first capacitor 46 communicates with a base (or control terminal) of the second transistor 44. A first end of the second capacitor 48 communicates with a collector of the second transistor 44 and a second end of the second capacitor 48 communicates with a base of the first transistor 42. The emitters of the first and second transistors 42 and 44, respectively, communicate with a first current source 50.

A net capacitance of the first VCO circuit 40 determines a frequency of an output signal. A control voltage signal 52 is applied to cathodes of first and second varactor diodes 54 and 56, respectively, to adjust the net capacitance of the first VCO circuit 40. For example, a charge pump may generate the control voltage signal 52 in a PLL. An anode of the first varactor diode 54 communicates with the collector of the first transistor 42, and an anode of the second varactor diode 56 communicates with the collector of the second transistor 44. A cathode of the first varactor diode 54 communicates with a cathode of the second varactor diode 56.

The first VCO circuit 40 that is illustrated in FIG. 2 is an LC-tank VCO that includes first and second inductors 58 and 60, respectively, at an output 62. A first end of the first inductor 58 communicates with the collector of the second transistor 44. A first end of the second inductor 60 communicates with the collector of the second transistor 44. The output signal 32 is referenced from second ends of the first and second inductors 58 and 60, respectively.

A DC signal may degrade when the VCO circuit includes coupling capacitors. Also, if the signal is directly coupled, the collector and base of the first and second transistors 42 and 44, respectively, will be at the same voltage. If the voltage is very low, this may drive the first and second transistors 42 and 44, respectively, into saturation. It is desirable to maintain the voltage at the collectors of the first and second transistors 42 and 44, respectively, relatively high with respect to the voltage at the bases of the first and second transistors 42 and 44, respectively. Therefore, a separate bias voltage signal 64 biases the bases of the first and second transistors 42 and 44, respectively through first and second resistors 66 and 68, respectively.

Beta values of the first and second transistors 42 and 44, respectively, may vary. This causes a difference in current through the first and second resistors 66 and 68, respectively, which leads to a difference in transconductance between the first and second transistors 42 and 44, respectively. Additionally, the bias voltage signal 64 is separately generated. The bias voltage signal 64 as well as the first and second resistors 66 and 68, respectively, contribute noise to the first VCO circuit 40.

Referring now to FIG. 3, a second VCO circuit 70 includes third and fourth transistors 72 and 74, respectively, that couple the positive feedback of the first and second transistors 42 and 44, respectively. For example, the third and fourth transistors 72 and 74, respectively, may be BJTs that operate as emitter followers, although other types of transistors may be used. An emitter of the third transistor 72 communicates with the base of the second transistor 44. A base of the third transistor 72 communicates with the collector of the first transistor 42. An emitter of the fourth transistor 74 communicates with the base of the first transistor 42. A base of the fourth transistor 74 communicates with the collector of the second transistor 44. A supply potential 76 is applied to collectors of the third and fourth transistors 72 and 74, respectively.

Current that flows through the third and fourth transistors 72 and 74, respectively, is sufficient to drive the bases of the first and second transistors 42 and 44, respectively. Therefore, the base of the third transistor 72 communicates with a second current source 78. The emitter of the third transistor 72 communicates with a third current source 80. The second VCO circuit 70 generates less noise than the first VCO circuit 40. The positive feedback of the second VCO circuit 70 does not have to be AC coupled. However, at high frequencies, the amount of current that the second VCO circuit 70 requires to reduce second harmonic distortion is very high.

SUMMARY OF THE INVENTION

A voltage-controlled oscillator (VCO) circuit includes first, second, third, and fourth transistors, each with a first terminal, a second terminal, and a control terminal. The first terminal of the first transistor communicates with the first terminal of the second transistor. The control terminals of the third and fourth transistors communicate with the second terminals of the first and second transistors, respectively. The first terminals of the third and fourth transistors communicate with the control terminals of the first and second transistors, respectively. First ends of first and second capacitances communicate with the second terminals of the first and second transistors, respectively. Second ends of the first and second capacitances communicate with the control terminals of the first and second transistors, respectively.

In other features, anodes of first and second varactor diodes communicate with the control terminals of the third and fourth transistors, respectively. A cathode of the first varactor diode communicates with a cathode of the second varactor diode. A control voltage that is applied to the cathode of the first varactor diode adjusts a net capacitance of the VCO circuit. The net capacitance determines an output frequency of the VCO circuit.

In other features, a phase lock loop circuit comprises the VCO circuit and further comprises a charge pump that generates the control voltage.

In other features, first ends of the first and second inductances communicate with the control terminals of the third and fourth transistors. An output signal of the VCO circuit is referenced from second ends of the first and second inductances.

In other features, the second terminals of the third and fourth transistors communicate with a supply potential. The first terminals of the first and second transistors communicate with a first current source. The control terminal of the first transistor communicates with a second current source. The control terminal of the second transistor communicates with a third current source. The first, second, and third current sources communicate with a ground potential.

In other features, a capacitance adjustment circuit communicates with the VCO circuit and generates a capacitance adjustment control signal. The capacitance adjustment control signal adjusts a net capacitance of the VCO circuit. First and second output terminals of the capacitance adjustment circuit communicate with the second terminals of the first and second transistors, respectively.

An output buffer buffers the output signal and adjusts an output impedance of the system. The first, second, third, and fourth transistors are bi-polar junction transistors. The VCO circuit is implemented in a wireless network device that is compliant with at least one of IEEE sections 802.11, 802.11a, 802.11b, 802.11g, 802.11n, and 802.16.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
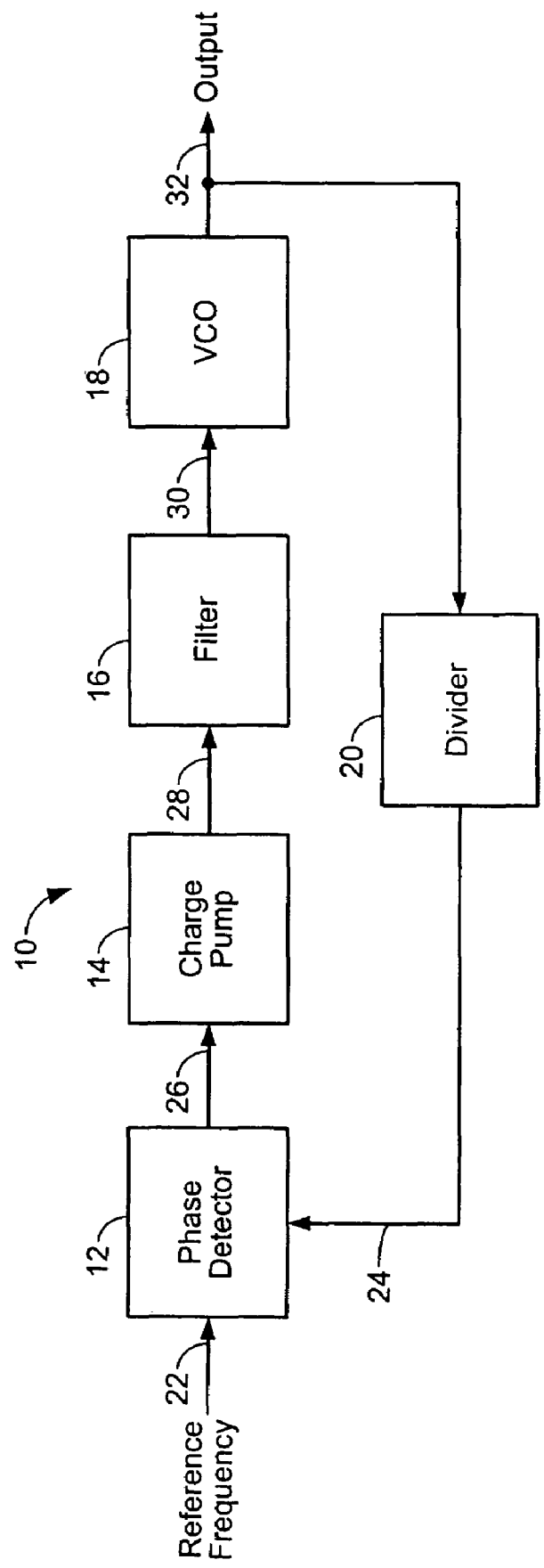
FIG. 1 is a functional block diagram of an exemplary phase-locked loop that includes a voltage-controlled oscillator (VCO) according to the prior art.
Figure 3:
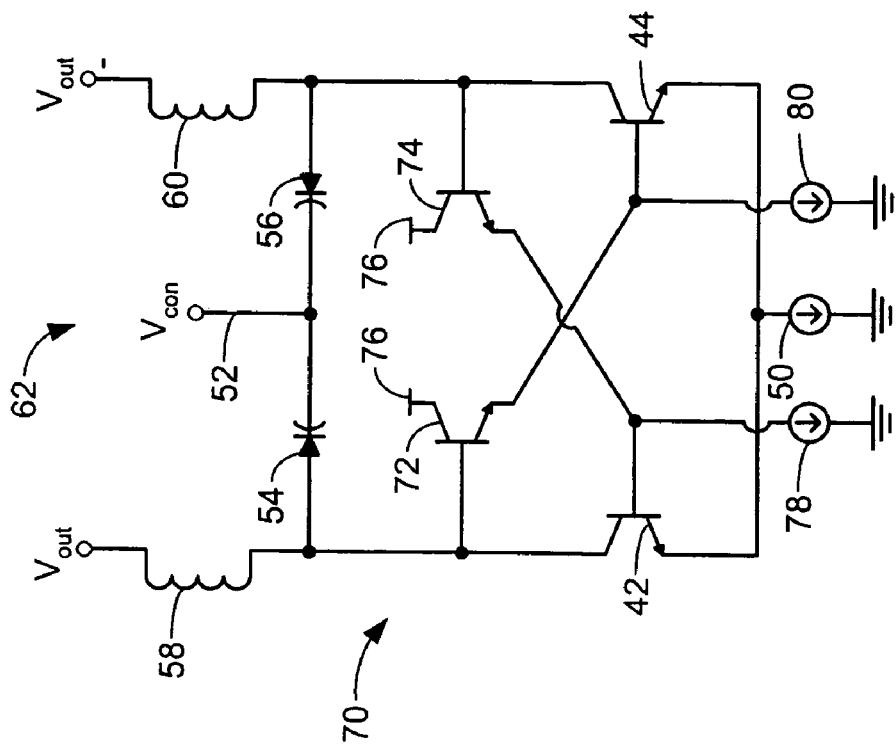
FIG. 3 is a schematic of a second VCO circuit that includes emitter follower transistors to couple positive feedback according to the prior art.
Figure 2:
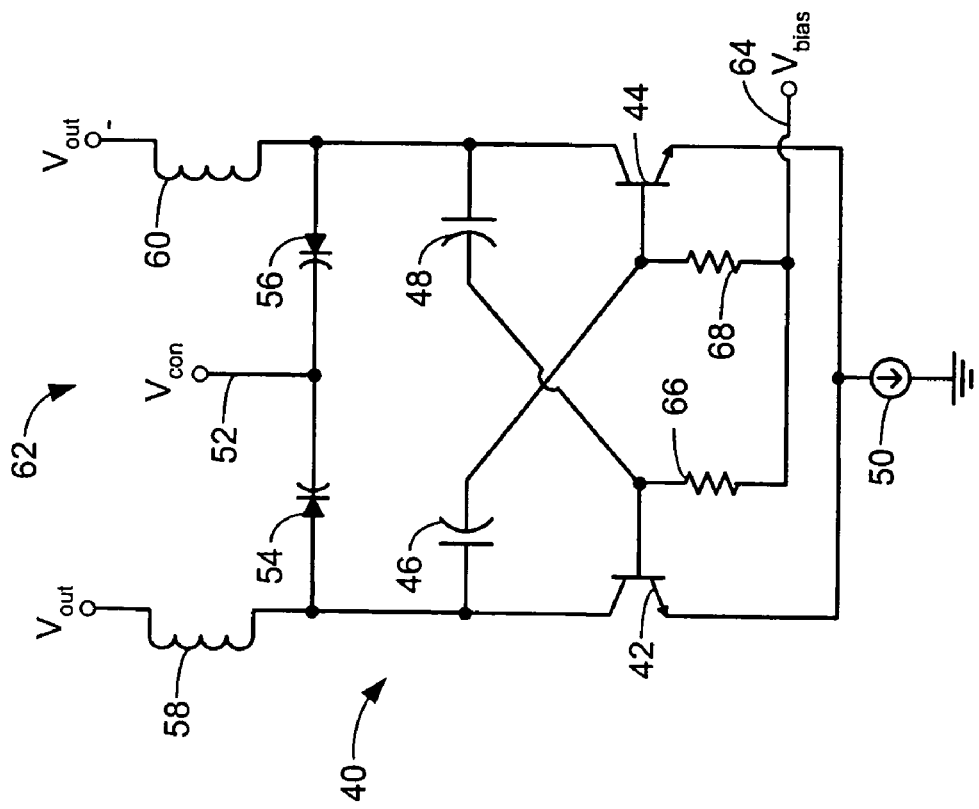
FIG. 2 is a schematic of a first VCO circuit that includes AC coupling capacitors and a bias voltage according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 4:
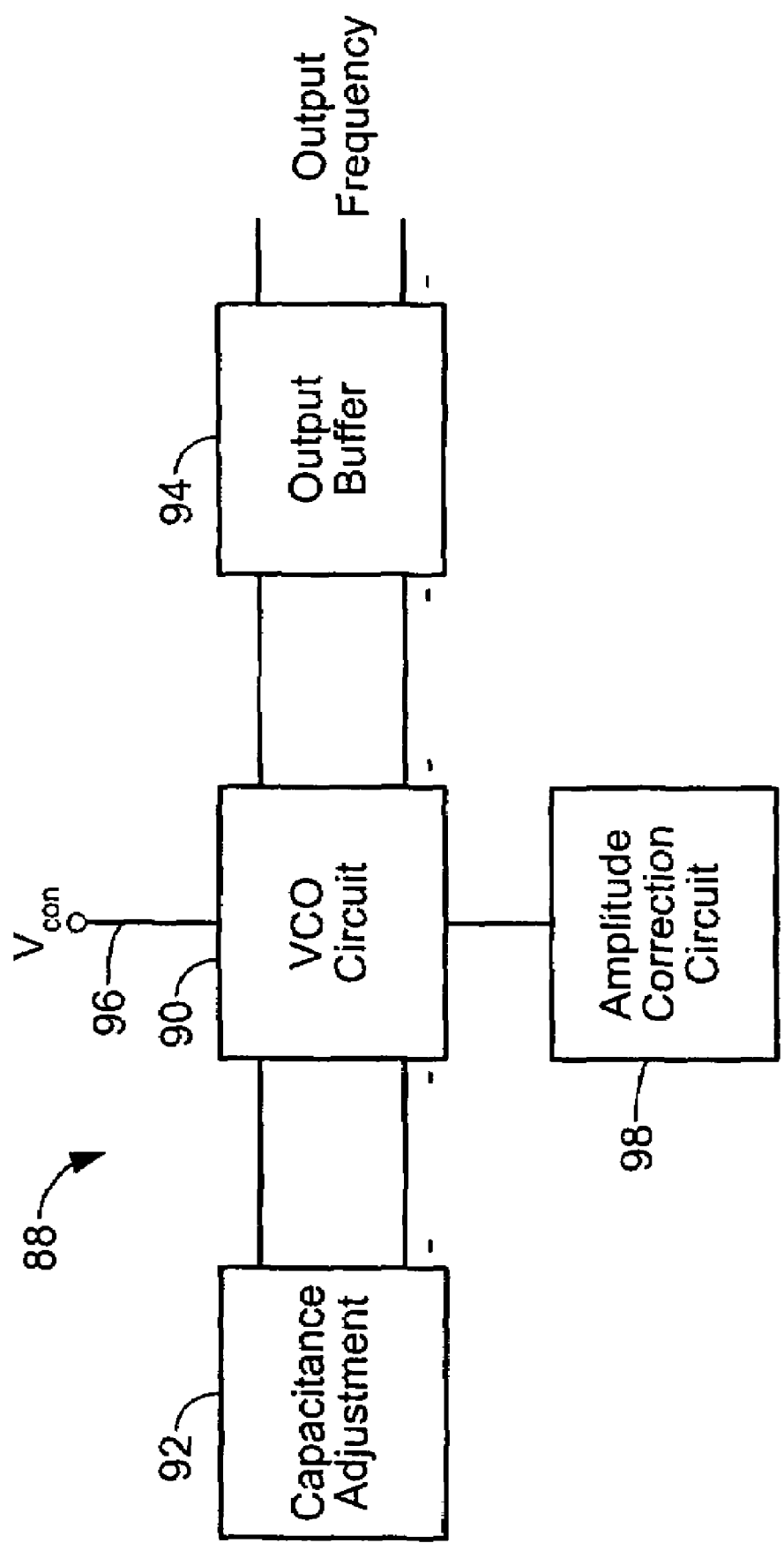
FIG. 4 is a functional block diagram of a VCO system that includes a capacitance adjustment circuit and an output buffer according to the present invention.

Referring now to FIG. 4, a voltage-controlled oscillator (VCO) system 88 according to the present invention includes a VCO circuit 90, a capacitance adjustment circuit 92, and an output buffer 94. The VCO system 88 of FIG. 4 provides two ways to adjust a net capacitance of the VCO circuit 90, which determines a frequency of an output signal of the VCO circuit 90. A control voltage signal 96 that is applied to the VCO circuit 90 adjusts the net capacitance. For example, a charge pump of a phase-locked loop may generate the control voltage signal 96.

The capacitance adjustment circuit 92 also adjusts the net capacitance of the VCO circuit 90. The control voltage signal 96 finely tunes the net capacitance and the capacitance adjustment circuit 92 coarsely tunes the net capacitance. The capacitance adjustment circuit 92 may be implemented by a plurality of capacitances and/or capacitors that can be added in series and/or parallel using one or more switches such as transistors. The output buffer 94 buffers the output signal of the VCO circuit 90 and adjusts an output impedance of the VCO system 88 to prevent loading effects.

The VCO system 88 also includes an amplitude correction circuit 98 that maintains a fixed range of current that is delivered to the VCO circuit 90.

Figure 5:
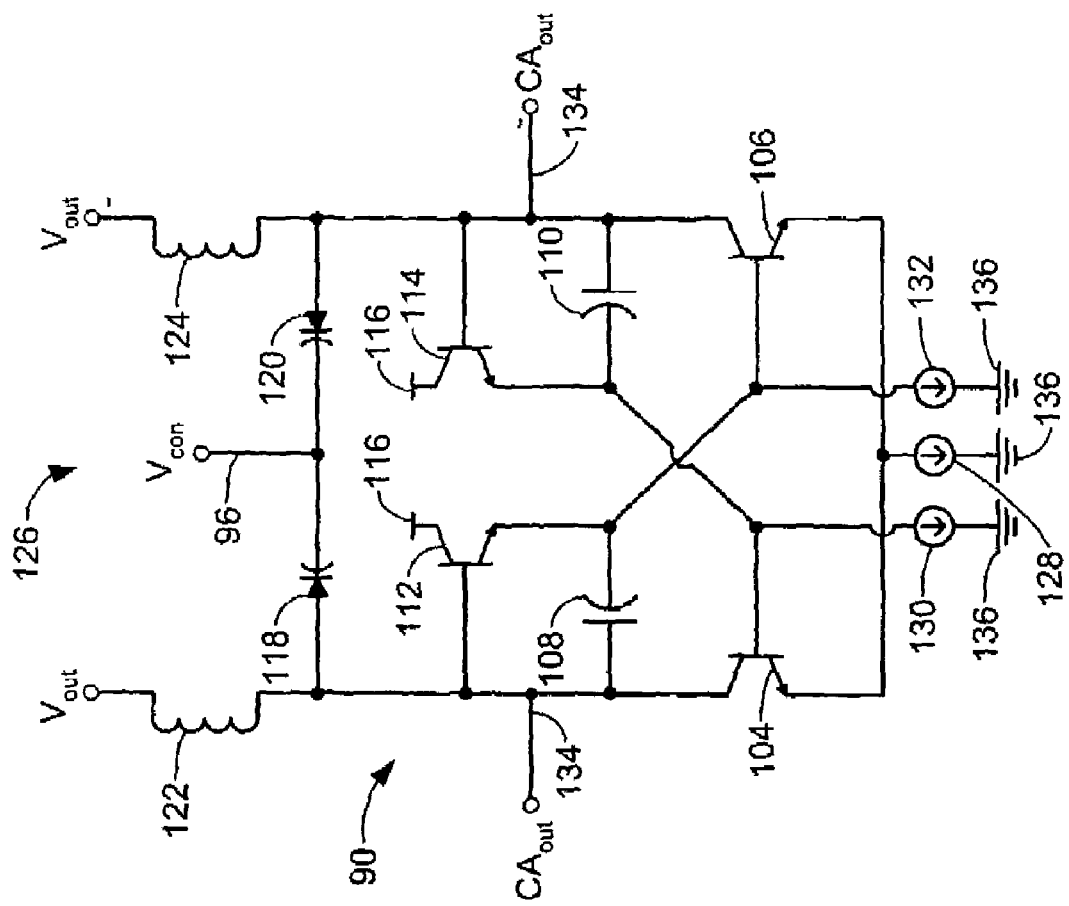
FIG. 5 is a schematic of a VCO circuit that includes coupling capacitors and emitter follower transistors according to the present invention.

Referring now to FIG. 5, the VCO circuit 90 includes first and second transistors 104 and 106, respectively. For example, the first and second transistors 104 and 106, respectively, may be bi-polar junction transistors (BJTs) that have collectors, emitters, and bases, and that have a negative transconductance. An emitter of the first transistor 104 communicates with an emitter of the second transistor 106. First and second capacitors 108 and 110, respectively, AC couple the positive feedback. A first end of the first capacitor 108 communicates with a collector of the first transistor 104. A second end of the first capacitor 108 communicates with a base of the second transistor 106. A first end of the second capacitor 110 communicates with a collector of the second transistor 106. A second end of the second capacitor 110 communicates with a base of the first transistor 104.

Third and fourth transistors 112 and 114, respectively, provide biasing for the first and second transistors 104 and 106, respectively. For example, the third and fourth transistors 112 and 114, respectively, may be BJTs that operate as emitter followers. An emitter of the third transistor 112 communicates with the base of the second transistor 106. A base of the third transistor 112 communicates with a collector of the first transistor 104. An emitter of the fourth transistor 114 communicates with a base of the first transistor 104. A base of the fourth transistor 114 communicates with the collector of the second transistor 106.

The second terminals of the third and fourth transistors 112 and 114, respectively, communicate with a supply potential 116. The control voltage signal 96 is applied to first and second varactor diodes 118 and 120, respectively. An anode of the first varactor diode 118 communicates with the base of the third transistor 112. An anode of the second varactor diode 120 communicates with the base of the fourth transistor 114. A cathode of the first varactor diode 118 communicates with a cathode of the second varactor diode 120. The control voltage signal 96 is applied to the cathodes of the first and second varactor diodes 118 and 120, respectively.

First and second inductors 122 and 124, respectively, form an output 126 of the VCO circuit 90. A first end of the first inductor 122 communicates with the base of the third transistor 112. A first end of the second inductor 124 communicates with the base of the fourth transistor 114. An output signal of the VCO circuit 90 is referenced from second ends of the first and second inductors 122 and 124, respectively. The emitters of the first and second transistors 104 and 106, respectively, communicate with a first current source 128. The base of the first transistor 104 communicates with a second current source 130, and the base of the second transistor 106 communicates with a third current source 132. The first, second, and third current sources 128, 130, and 132, respectively, communicate with a ground potential 136.

The second and third current sources 130 and 132, respectively, bias the third and fourth transistors 112 and 114, respectively, with a relatively low current. Since the amount of current is small, the bandwidth of the third and fourth transistors 112 and 114, respectively, is typically too low. Therefore, the first and second capacitors 108 and 110, respectively, communicate in parallel with the third and fourth transistors 112 and 114, respectively, and AC couple the signals of the third and fourth transistors 112 and 114, respectively, to the remainder of the VCO circuit 90. This allows the signals of the third and fourth transistors 112 and 114, respectively, to be coupled without requiring a large current through the third and fourth transistors 112 and 114, respectively. The capacitance adjustment circuit 92 communicates with the VCO circuit 90 at the bases of the third and fourth transistors 112 and 114, respectively, through a capacitance adjustment control signal 134. Both the control voltage signal 96 and the capacitance adjustment control signal 134 adjust a net capacitance of the VCO circuit 90. The net capacitance varies a frequency of the output signal.

The VCO circuit 90 may be categorized into three sections: an inductance section, a capacitance section, and a negative transconductance section. The inductance section includes the first and second inductors 122 and 124, respectively. The capacitance section includes the capacitance adjustment control signal 134 and the control voltage signal 96. The negative transconductance section includes the first and second transistors 104 and 106, respectively, which are preferably cross-coupled BJTs.

It is desirable for the VCO circuit 90 to function with as little phase noise as possible. Phase noise may cause frequency fluctuations in the output signal. Therefore, a phase noise requirement of a transceiver and/or a PLL may determine a maximum allowable phase noise for satisfactory operation. For example, a maximum phase noise requirement may be set to −93 dBc/Hz at 100 kHz offset from the frequency of oscillation.

Specific parameters of components in the VCO circuit 90 have a significant effect on phase noise. These parameters include shot noise of the first and second transistors 104 and 106, respectively, base resistance of the first and second transistors 104 and 106, respectively, and series resistance of the first and second inductors 122 and 124, respectively. The shot noise of the first and second transistors 104 and 106, respectively, is a function of input current and temperature. Otherwise, the VCO circuit 90 is biased in an appropriate region of operation to reduce phase noise contribution from the other components.

The VCO circuit 90 of the present invention is an improvement over conventional VCO circuit designs. The third and fourth transistors 112 and 114, when operating as emitter followers, allow the biasing point to be set with very little current. Also, high frequency signals are coupled by the first and second capacitors 108 and 110, respectively. A separate bias voltage signal that is required by conventional VCO circuits with coupling capacitors is no longer needed. Additionally, second harmonic distortion that is associated with conventional VCO circuits that include emitter followers is eliminated. While FIG. 1 illustrates a VCO circuit as part of a PLL device, those skilled in the art can appreciate that the VCO circuit 90 of the present invention is applicable to other devices.

Figure 6:
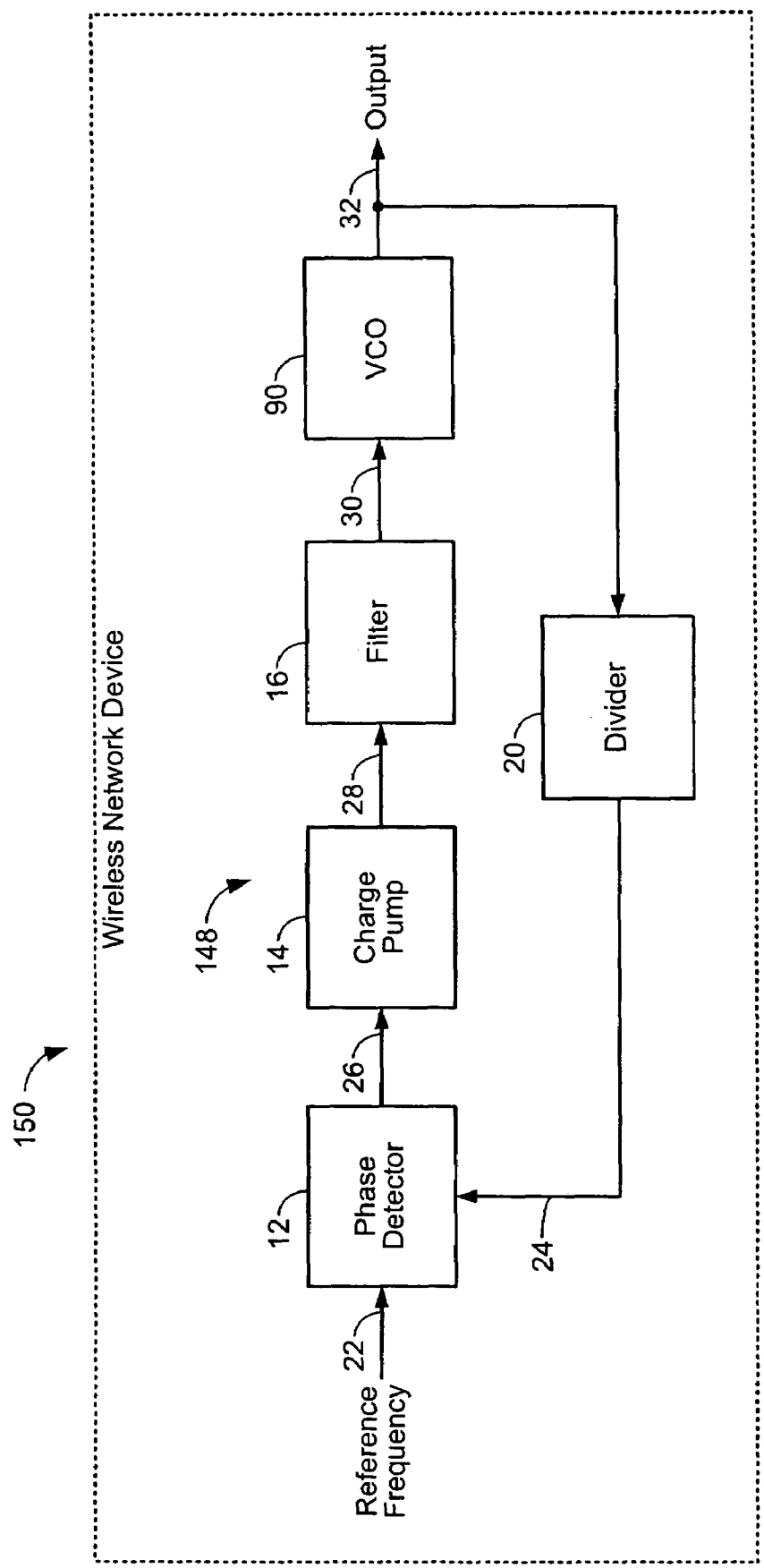
FIG. 6 is a functional block diagram of the VCO implemented in a wireless network device.

Referring now to FIG. 6, the VCO 90 according to the present invention is implemented in a PLL circuit 148 of a wireless network device 150. The wireless network device 150 is compliant with IEEE sections 802.11, 802.11a, 802.11b, 802.11g, 802.11n, 802.16, and/or other existing or future wireless standards. IEEE sections 802.11, 802.11a, 802.11b, 802.11g, 802.11n, 802.16 are hereby incorporated by reference in their entirety.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

What is claimed is:

1. A voltage-controlled oscillator (VCO) circuit, comprising:
first, second, third, and fourth transistors, each with a first terminal, a second terminal, and a control terminal,
wherein said first terminal of said first transistor communicates with said first terminal of said second transistor, said control terminals of said third and fourth transistors communicate with said second terminals of said first and second transistors, respectively, and said control terminals of said second and first transistors are responsive to signals generated at said first terminals of said third and fourth transistors, respectively; and
first and second capacitances, wherein first ends of said first and second capacitances communicate with said second terminals of said first and second transistors, respectively, and wherein second ends of said second and first capacitances communicate with said control terminals of said first and second transistors, respectively.

2. The VCO circuit of claim 1 further comprising first and second varactor diodes, wherein anodes of said first and second varactor diodes communicate with said control terminals of said third and fourth transistors, respectively, and wherein a cathode of said first varactor diode communicates with a cathode of said second varactor diode.

3. The VCO circuit of claim 2 wherein a control voltage that is applied to said cathode of said first varactor diode adjusts a net capacitance of said VCO circuit.

4. The VCO circuit of claim 3 wherein said net capacitance determines an output frequency of said VCO circuit.

5. A phase-locked loop (PLL) circuit comprising the VCO circuit of claim 3 and further comprising a charge pump that generates said control voltage.

6. The VCO circuit of claim 1 further comprising first and second inductances, wherein first ends of said first and second inductances communicate with said control terminals of said third and fourth transistors.

7. The VCO circuit of claim 6 wherein an output signal of said VCO circuit is referenced from second ends of said first and second inductances.

8. The VCO circuit of claim 1 wherein said second terminals of said third and fourth transistors communicate with a supply potential.

9. The VCO circuit of claim 1 wherein said first terminals of said first and second transistors communicate with a first current source.

10. The VCO circuit of claim 9 wherein said control terminal of said first transistor communicates with a second current source and said control terminal of said second transistor communicates with a third current source.

11. The VCO circuit of claim 10 wherein said first, second, and third current sources communicate with a ground potential.

12. A system comprising the VCO circuit of claim 1 and further comprising a capacitance adjustment circuit that communicates with said VCO circuit and that generates a capacitance adjustment control signal, wherein said capacitance adjustment control signal adjusts a net capacitance of said VCO circuit.

13. The system of claim 12 wherein first and second output terminals of said capacitance adjustment circuit communicate with said second terminals of said first and second transistors, respectively.

14. A system comprising the VCO circuit of claim 7 and further comprising an output buffer that buffers said output signal and that adjusts an output impedance of said system.

15. The VCO circuit of claim 1 wherein said first, second, third, and fourth transistors are bi-polar junction transistors.

16. A voltage-controlled oscillator (VCO) system, comprising:
a VCO circuit that includes:
first, second, third, and fourth transistors, each with a first terminal, a second terminal, and a control terminal,
wherein said first terminal of said first transistor communicates with said first terminal of said second transistor, said control terminals of said third and fourth transistors communicate with said second terminals of said first and second transistors, respectively, and said control terminals of said second and first transistors are responsive to signals generated at said first terminals of said third and fourth transistors, respectively; and
first and second capacitances, wherein first ends of said first and second capacitances communicate with said second terminals of said first and second transistors, respectively, and wherein second ends of said second and first capacitances communicate with said control terminals of said first and second transistors, respectively;
a capacitance adjustment circuit that that communicates with said VCO circuit and that adjusts a net capacitance of said VCO circuit; and
an output buffer that buffers an output signal of said VCO circuit and that adjusts an output impedance of said VCO system.

17. The VCO system of claim 16 wherein said VCO circuit further includes first and second varactor diodes, wherein anodes of said first and second varactor diodes communicate with said control terminals of said third and fourth transistors, respectively, and wherein a cathode of said first varactor diode communicates with a cathode of said second varactor diode.

18. The VCO system of claim 17 wherein a control voltage that is applied to said cathode of said first varactor diode adjusts said net capacitance of said VCO circuit.

19. The VCO system of claim 18 wherein said net capacitance determines an output frequency of said VCO circuit.

20. A phase-locked loop (PLL) circuit that comprises the VCO system of claim 18 and further comprises a charge pump that generates said control voltage.

21. The VCO system of claim 16 wherein said VCO circuit further includes first and second inductances, wherein first ends of said first and second inductances communicate with said control terminals of said third and fourth transistors.

22. The VCO system of claim 21 wherein said output signal of said VCO circuit is referenced from second ends of said first and second inductances.

23. The VCO system of claim 16 wherein said second terminals of said third and fourth transistors communicate with a supply potential.

24. The VCO system of claim 16 wherein said first terminals of said first and second transistors communicate with a first current source.

25. The VCO system of claim 24 wherein said control terminal of said first transistor communicates with a second current source and said control terminal of said second transistor communicates with a third current source.

26. The VCO system of claim 25 wherein said first, second, and third current sources communicate with a ground potential.

27. The VCO system of claim 16 wherein first and second output terminals of said capacitance adjustment circuit communicate with said second terminals of said first and second transistors, respectively.

28. The VCO system of claim 16 wherein said first, second, third, and fourth transistors are bi-polar junction transistors.

* * * * *

UNITED STATES PATENT AND TRADEMARK OFFICE
CERTIFICATE OF CORRECTION

PATENT NO. : 7,190,232 B1 Page 1 of 1
APPLICATION NO. : 10/747521
DATED : March 13, 2007
INVENTOR(S) : Swee-Ann Teo It is certified that error appears in the above-identified patent and that said Letters Patent is hereby corrected as shown below:

Column 8, Line 26    Delete second occurrence of "that"

Signed and Sealed this

Thirty-first Day of July, 2007

JON W. DUDAS
*Director of the United States Patent and Trademark Office*